US 8,179,211 B2

(12) United States Patent
Bauer et al.

(10) Patent No.: US 8,179,211 B2
(45) Date of Patent: May 15, 2012

(54) RF-FILTER WITH IMPROVED ADJACENT CHANNEL SUPPRESSION

(75) Inventors: Thomas Bauer, Munich (DE); Christian Math, Munich (DE)

(73) Assignee: Epcos AG, Munich (DE)

( * ) Notice: Subject to any disclaimer, the term of this patent is extended or adjusted under 35 U.S.C. 154(b) by 749 days.

(21) Appl. No.: 11/995,022

(22) PCT Filed: Jun. 6, 2006

(86) PCT No.: PCT/EP2006/005270
§ 371 (c)(1),
(2), (4) Date: Apr. 17, 2008

(87) PCT Pub. No.: WO2007/006375
PCT Pub. Date: Jan. 18, 2007

(65) Prior Publication Data
US 2010/0127799 A1    May 27, 2010

(30) Foreign Application Priority Data
Jul. 8, 2005   (DE) .......................... 10 2005 032 058

(51) Int. Cl.
*H03H 9/64*   (2006.01)
(52) U.S. Cl. ........................................ 333/193; 333/195
(58) Field of Classification Search .................. 333/193, 333/195, 133; 310/313 R–313 D
See application file for complete search history.

(56) References Cited

U.S. PATENT DOCUMENTS

| 5,307,035 A * | 4/1994 | Dufilie et al. ................. 333/193 |
| 5,459,368 A * | 10/1995 | Onishi et al. ............... 310/313 R |
| 5,592,135 A * | 1/1997 | Taguchi et al. ............... 333/193 |
| 5,914,646 A | 6/1999 | Hashimoto |
| 6,037,698 A | 3/2000 | Ueda et al. |
| 6,150,904 A | 11/2000 | Taniguchi et al. |
| 6,154,940 A | 12/2000 | Onishi et al. |
| 6,388,545 B1 | 5/2002 | Kawachi et al. |
| 6,593,678 B1 * | 7/2003 | Flowers .................... 310/313 R |

(Continued)

FOREIGN PATENT DOCUMENTS

EP      0644610      3/1995

(Continued)

OTHER PUBLICATIONS

International Search Report from corresponding PCT Application No. PCT/EP2006/005270, mailed Nov. 13, 2006, 7 pages.

(Continued)

*Primary Examiner* — Dean O Takaoka
*Assistant Examiner* — Alan Wong
(74) *Attorney, Agent, or Firm* — Fish & Richardson P.C.

(57) ABSTRACT

The invention relates to a filter with a first partial filter (TF1), comprising a series resonator (S1) and at least two parallel resonators (P1, P2) that are arranged in respective parallel branches, and with a second partial filter (TF2) configured as a DMS filter. The filter also comprises a housing with a plurality of internal housing contacts (GKi) on a base plate that are connected to terminal areas on the substrate (SU) and external housing contacts (GKa), fewer than the internal contacts, that are connected to the internal housing contacts (GKi) via lines (DL1, DL2) guided within the base plate. At least two lines for connections to ground of the first parallel resonator (P1) and the second partial filter (TF2) are guided separately in or on the base plate and are connected to at least two different external housing contacts (E4, E2).

22 Claims, 8 Drawing Sheets

U.S. PATENT DOCUMENTS

| | | | |
|---|---|---|---|
| 6,762,657 B2 * | 7/2004 | Takamine | 333/193 |
| 6,924,715 B2 * | 8/2005 | Beaudin et al. | 333/133 |
| 7,286,028 B2 * | 10/2007 | Kushitani et al. | 333/193 |
| 2002/0014121 A1 | 2/2002 | Urabe et al. | |
| 2004/0155730 A1 | 8/2004 | Iwamoto et al. | |

FOREIGN PATENT DOCUMENTS

| | | |
|---|---|---|
| EP | 0 853 381 | 7/1998 |
| EP | 0 664 610 | 11/1998 |
| EP | 0 637 871 | 12/1998 |
| EP | 0 600 705 | 1/1999 |
| EP | 0 961 404 | 12/1999 |
| EP | 1 394 941 | 3/2004 |
| JP | 07-212183 | 8/1995 |
| JP | 08-065089 | 3/1996 |
| JP | 09-036695 | 2/1997 |
| JP | 2000-049565 | 2/2000 |
| JP | 2000-183680 | 6/2000 |
| JP | 2004-096244 | 3/2004 |
| WO | WO 2005004327 A1 * | 1/2005 |

OTHER PUBLICATIONS

Written Opinion from corresponding PCT Application No. PCT/EP2006/005270, mailed Nov. 13, 2006, 10 pages.

English translation of Written Opinion of the International Preliminary Report on Patentability from International Application No. PCT/EP2006/005270, 12 pages.

Notification of Reasons for Refusal (type 1 office action) in Japanese Patent Application No. 2008-519810, mailed Jan. 6, 2012, 6 pages.

* cited by examiner

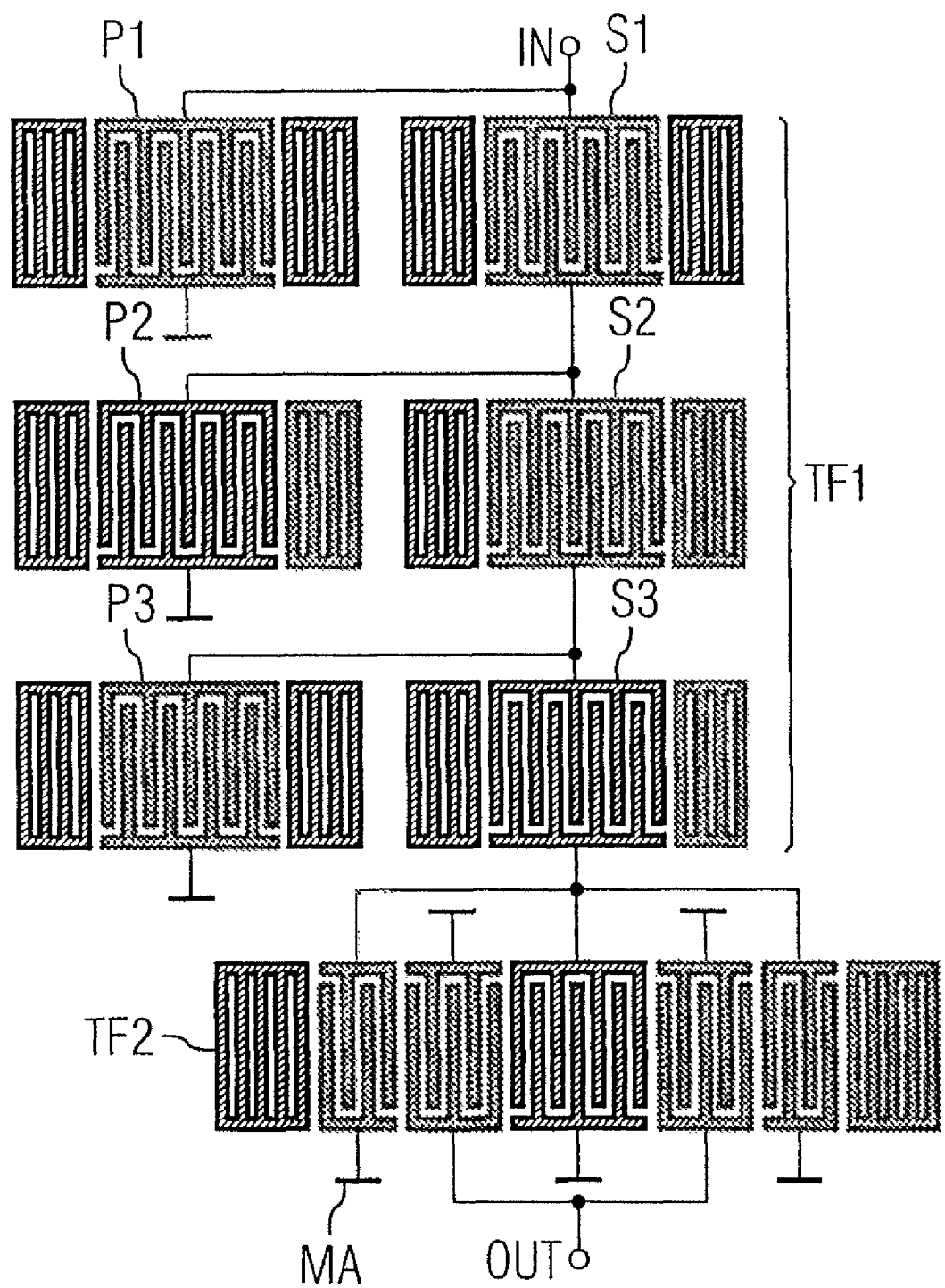

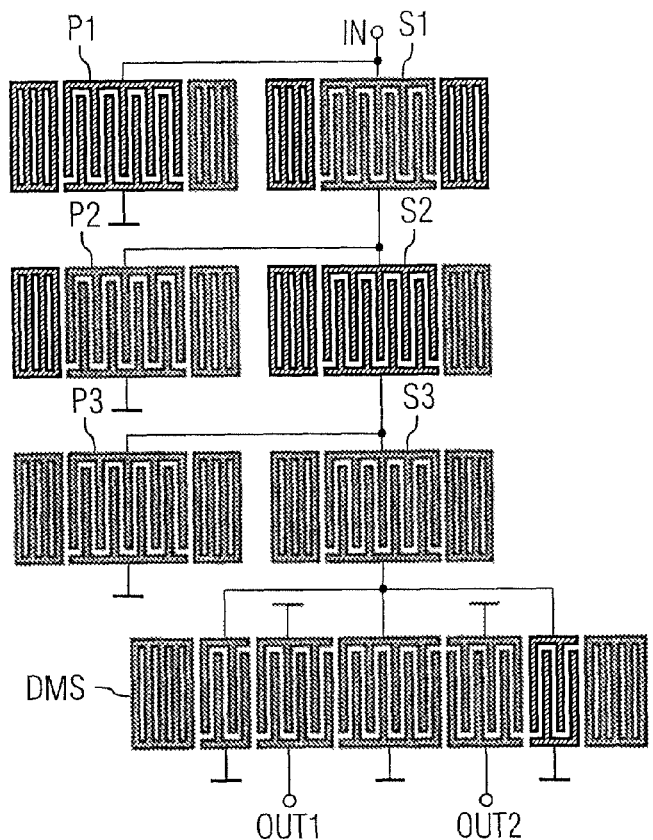
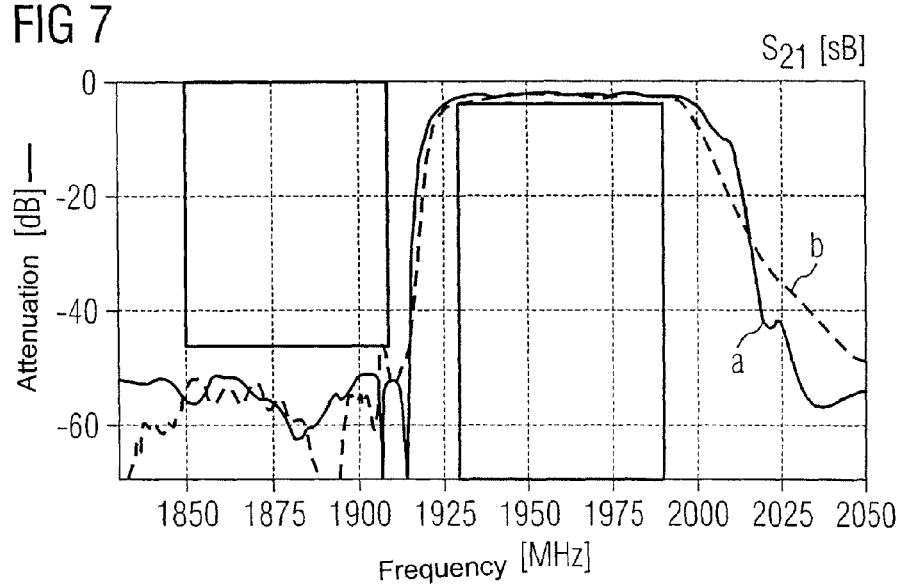

RF-FILTER WITH IMPROVED ADJACENT CHANNEL SUPPRESSION

BACKGROUND

RF filters are required particularly in terminal devices for mobile communications. They are generally designed for use in mobile radio systems, which transmit and receive in frequency bands lying close to one another. The receive filters are typically constructed as bandpass filters, the passband of which corresponds at least to the bandwidth of the RX band. It is also generally required that the frequencies of the associated TX-band be suppressed.

Various technologies are suitable for manufacturing RF filters. Dielectric filters are produced from discrete L and C elements and require a number of discrete elements in order to provide the required filtering properties. Microwave ceramic filters are economical to manufacture, have low insertion loss, but are generally too large for installation in miniaturized terminal devices. Filters constructed on the basis of bulk acoustic wave resonators or surface acoustic wave elements offer good electrical properties. SAW or surface wave elements, which are distinguished by a small size and a great variety with respect to the electrical parameters that can be adjusted, are particularly preferred.

RF filters on a SAW basis can be constructed from a number of resonators as DMS filters (dual-mode SAW) or as reactance filters, which are connected in a serial branch and parallel branches thereto in the form of a ladder-type arrangement or a lattice arrangement.

In addition to small size and easy manufacturability, a given bandwidth is required for an RF filter, wherein the passband should fall off with a steep edge towards the stopband. The insertion loss in the passband should be minimal in order to minimize power losses. On the other hand, a RF filter should be power-durable and in the long term there should be no damage to the electrode structures even with high input and output power.

In order to improve the adjacent-band suppression, the suppression of TX frequencies in a RX filter, for instance, it was already proposed to connect a two-track, three-transducer DMS filter at the input and output to parallel resonators. Such a structure does not prove sufficiently power durable, however, and has a relatively high insertion loss.

A pure reactance filter requires an excessively large number of basic elements, each basic element consisting of a series resonator and a parallel resonator, to achieve sufficient adjacent-band suppression. With an increasing number of basic elements, however, the insertion loss of such filters deteriorates.

SUMMARY

The problem of the present approach is therefore to specify a RF filter that has good adjacent-band suppression and combines it with other advantageous properties.

A RF filter is proposed which is composed of a first and a second sub-filter. The first sub-filter is designed as a reactance filter and has at least two parallel resonators and one series resonator. The second sub-filter is constructed as a DMS filter and has at least two interdigital transducers. In order to achieve sufficient adjacent-band suppression, this filter is installed in a specific housing, in which the ground terminals of the first parallel resonator and the second sub-filter are run separately from one another and lead to separated external housing contacts.

It has been shown that the galvanic coupling between the different filter elements, which would otherwise lead to undesirable signals at the output, is reduced with these separate ground lines. These undesired signals can impair the passband, depending on their nature, lead to undesired peaks in the stopband, or in general falsify the useful signal with signals that should be suppressed.

The first and second sub-filters can be constructed on a common piezoelectric substrate and connected to one another there. The first sub-filter is preferably connected to the input. This has the advantage that the more power-durable reactance filter as the first sub-filter absorbs a part of the power of the received signal, so that the second sub-filter, ie the DMS filter, is loaded with a lower signal level. Particularly in the adjacent band, the reactance filter absorbs the greatest part of the power. Thus the proposed RF filter becomes more power-durable overall.

A good adjacent-band suppression and a high edge steepness are also achieved with the proposed filter. This utilizes the good near-range suppression of a reactance filter, which can be adjusted well by a suitable frequency position of the poles, particularly by suitable selection of the resonant frequency of the parallel resonators. A good far-range suppression, on the other hand, is provided by the DMS filter. The advantageous properties of the different filter types in the combined HF filter are added up in the combination of the two sub-filters.

The housing of the filter can comprise a base plate that has at least one dielectric layer that is essentially electrically nonconductive. In case of several dielectric layers, a metallization plane can be arranged between each two layers. Conductor traces or circuitry in general are structured in the metallization plane. The conductor traces and circuit elements are connected to internal and external housing contacts by via-holes. A via-hole is understood to mean a hole leading through one or more dielectric layers and filled or at least plated with conductive material.

The internal housing contacts serve for connection of the substrate contacts of the first and second sub-filters, whereas the outer housing contacts serve for connection of a filter to an external circuitry environment. The ground terminal of the first parallel resonator, which is the closest to the filter input, is preferably led separately and separated from other lines through the housing and, in particular through the base plate, and directly connected to a first external housing contact. The effect of this is that galvanic coupling effects with the first parallel branch are caused only by possible impedances in the external circuitry environment. The outer ground contacts, however, are usually very well connected to the ground of the circuitry environment, so that galvanic coupling effects in the form of electrical cross talk are minimized.

The connection between the ground terminal of the first parallel resonator and the first external housing contact is led in a straight line and is constructed exclusively as a via-hole. This guarantees that the inductance of this line is minimized for a given thickness of the housing or the base plate of the housing. This avoids an increase in the pole/zero distance of the resonator, and a greater steepness of the left edge can be achieved. The attenuation at very high frequencies is also thereby improved. This line to the base plate, optimized with respect to galvanic coupling, is particularly advantageous for the first parallel branch, since its high power consumption and thus high current flow, caused by the position at the filter input, also has a high potential for coupling to other lines and metallizations.

It is additionally advantageous to lead the ground terminal of the second parallel resonator separately from other through-lines through the housing and to connect it to an external housing contact, for example, the housing contact of the first parallel resonator. Thus there is a connection of the two ground terminals of the first and second parallel resonator only on the level of the outer housing contact, which generally represents a good ground or is connected to a good ground, so that the coupling between the two ground lines is minimized for this reason alone.

For further improvement of adjacent-band suppression, a second series resonator and a third parallel resonator in a third parallel branch can be provided. The ground terminal of the third parallel resonator is preferably connected to a second external housing contact, which is not identical to the first housing contact.

Thus, the coupling of the first and second parallel branch, or their ground terminals, is reduced.

A suitable filter function is effected if the second sub-filter has a DMS track with five transducers. It is alternatively possible to implement the second sub-filter with two electrically parallel-connected DMS tracks with three transducers each. The loss properties are thereby further improved in comparison to a single-track, three-transducer DMS arrangement.

In order to improve the performance of the reactance filter, it is proposed to cascade at least the first series resonator, preferably the first parallel resonator as well, and optionally additional series resonators, ie, to split them into two sub-resonators connected in series. To maintain the impedance of the cascaded resonator, the resonator surface must be increased as a compensation, which, in the case of a double cascade, implies a quadrupling of the overall resonator surface as compared to an unsplit resonator. This can be achieved by an increase of the number of fingers or an increase of the aperture. Together with the low voltage that is now present at each of the sub-resonators connected in series, this results in a marked improvement of the cascaded resonator's power durability.

The RF filter can have an asymmetrical input and an asymmetrical output. In this case it is sufficient if the housing has four external housing contacts. If the output is connected symmetrically, however, then an additional housing contact is necessary, so that at least five external housing contacts must be available. But it is always possible to provide a larger number of external housing contacts, which are disadvantageous as a rule with respect to their space requirement and the increased circuitry expense for connecting the filter to an external circuitry environment. Without great additional expense, however, an uneven number of external housing contacts can be increased by one to the next higher even number.

In order to prevent damage to the filter by electrostatic discharge due to the pyroelectric effect, it makes sense to connect the separated grounds on the base plate high-ohmically on the substrate (with at least 1 k$\Omega$ for example). This can be implemented, for example, by metallic meander structures on the substrate surface. The crosstalk and thus the adjacent-band suppression is not influenced by such a high-ohmic connection.

An improved edge steepness can be achieved if the adjacent endmost electrode fingers of different transducers of the second sub-filter are both connected hot or both connected cold. This means that the two adjacent electrode fingers of different transducers are either both connected to a signal line or are both connected to a ground terminal.

A housing that is improved with respect to shielding and integrity is obtained if the substrate with the sub-filters is arranged in the housing between the base plate and a cover, in which the cover comprises at least one electrically conductive layer. To improve the shielding, the cover is electroconductively connected to the ground connection inside the base plate and additionally connected to a ground terminal of the filter or to an external housing contact of the filter that is connected to ground. The electrically conductive cover of the housing can be connected to the ground connection inside or on the base plate via several points. Thus different ground contacts of the filter can be connected to one another via the cover. The cover is preferably asymmetrically connected to the circuitry. A single-sided, improved ground connection of the cover that is undertaken by way of several via-holes that are connected in parallel as the output side is advantageous.

The number of ground terminals present on the substrate of the two sub-filters typically exceeds the number of external housing contacts. Therefore it is proposed that, in the interior of the housing and in particular in the interior of the base plate, at least two mutually isolated internal ground surfaces, each connecting several ground terminals of the first and the second sub-filter to one another, be provided. The internal ground surfaces are in turn connected by via-holes to the external housing contacts.

It is also possible to use several via-holes for connection of the internal ground surfaces to the external housing contacts, whereby the inductance in the entire ground branch is reduced. This reduces the galvanic coupling of the ground branches connected in this way, and thus improves the selection behavior of the filter.

Another improvement of the passband, and in particular, a steeper left edge can be obtained if capacitors are connected in parallel to the parallel resonators. Such parallel capacitors are known for reducing the pole/zero distance of the resonators and hence improving the edge steepness. They can advantageously be realized in the form of metallic structures on the substrate surface. It is also possible, for example, to construct the capacitors as interdigital structures. In order that these interdigital structures function as much as possible as a pure capacitance and do not generate any losses in the form of emitted waves, it is advantageous to select a finger period for them that is markedly smaller than the finger period of the transducers in the first and second sub-filters.

An additional possibility for preventing the emission of acoustic waves from the capacitors realized as interdigital structures is to rotate the interdigital structures and orient them along a crystal axis in which no waves are excited. If a substrate of lithium tantalate (LT) is used for example, this can be achieved by a rotation of 90°.

DESCRIPTION OF THE DRAWINGS

The proposed RF filter will be explained in detail below on the basis of embodiments and the associated figures. These are purely schematic and therefore not drawn to scale.

FIG. 1 shows a first possible electrode structure for the first and second sub-filters, FIG. 2, three metallization planes of a two layer base plate, FIG. 3, different schematic cross sections through housings with one-layer or two-layer base plates, FIG. 4, an equivalent circuit diagram of a possible connection of the filter elements, FIG. 5, a second electrode structure for the first and second sub-filters, FIG. 6, various possibilities for realizing parallel capacitors, FIG. 7, the transmission curve of a filter according to the invention in comparison to prior art, FIGS. 8 and 9, a comparison of the transmission curve of proposed filters with test structures in which internal grounds are connected to one another in the housing, FIG. 10, the effect of a symmetric connection of the housing cover in comparison to an asymmetric connection, FIG. 11 two possibilities for splitting a resonator into two sub-resonators.

DETAILED DESCRIPTION

Advantageous topologies for the first sub-filter consist of three to four basic elements, which can be realized, starting from the filter input, in a PSPSP resonator structure, where P stands for a parallel resonator and S for a series resonator. FIG. 1 shows the metallization structure on the piezoelectric substrate for the first and second sub-filters, wherein six resonators S, P that are connected in the sequence PSPSPS and form five basic elements are used for the first sub-filter. First parallel resonator P1 is arranged in a first parallel branch that is directly connected to the input IN. First series resonator S1 is likewise connected to input IN. The endmost third series resonator S3 in the first sub-filter is connected to the input of the second sub-filter.

Second sub-filter TF2 consists of five interdigital transducers, wherein three transducers are connected to the input side, or to the output of the first sub-filter respectively, and two transducers to output OUT. Transducers connected to the input and the output are arranged alternately. For single-ended operation, ie, an operating mode asymmetric on both sides, the finger arrangement of the individual transducers in second sub-filter TF2 is constructed such that an endmost electrode finger of an input transducer and the directly adjacent endmost electrode transducer of an output transducer are each arranged here at hot potential. Each transducer comprises two interleaved comb-like electrode structures, also known as an interdigital structure. Each group of several respective electrode fingers is connected to a common bus bar. While the signal is applied to one bus bar, the other bus bar of the same transducer is connected to a ground terminal MA. In the second sub-filter TF2, the input transducers are connected in parallel and connected by their hot bus bars to the output of the third series resonator. The two hot bus bars of the two output transducers connected in parallel are likewise connected to output OUT. The illustrated filter thus can be operated asymmetrically, so that only one signal-carrying line is required on the input side and the output side. It is fundamentally possible here as well as for practically all RF filters, to interchange the input and the output of the filter.

First sub-filter TF1 has one ground terminal for each of the three parallel resonators at each of the additional terminals, while second sub-filter TF2 has one ground terminal for each of the five transducers. This implies a total of eight ground terminals, one input and one output that are formed on the surface of the substrate as terminal pads or as solderable metallized surfaces.

Figure 2A:
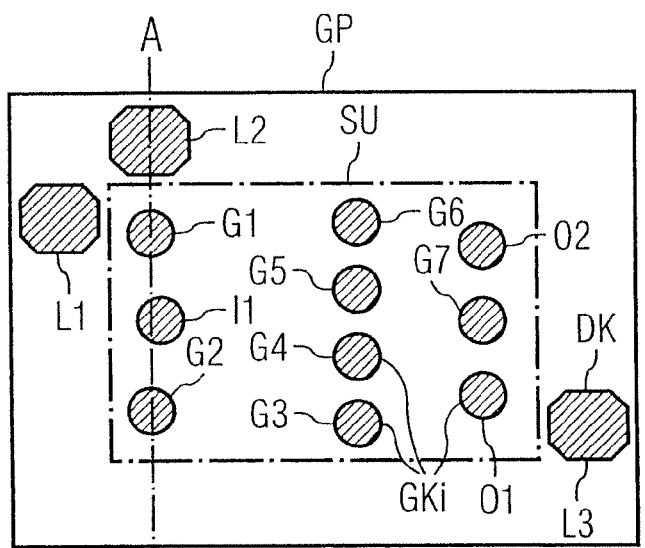

In a schematic representation, FIG. 2 shows a possible configuration of the circuit to be realized inside the housing with three metallization planes. FIG. 2*a* shows the surface of base plate GP of the housing which has a number of internal housing contacts $GK_1$ corresponding to the number of terminals of the filter. Relative to the embodiment represented in FIG. 1, this would be ten contacts. In the selected embodiment however, the three mass terminals MA shown at the bottom in FIG. 1 are already connected to one another on the substrate. Therefore the two terminals connected to the output transducers are led separately to internal housing contacts $GK_1$, so that nine internal housing contacts are required for connecting the terminals on the substrate. In FIG. 2*a* a tenth contact is shown, which is introduced solely for reasons of symmetry and promotes the stability of the housing. Also arranged on the surface area of the base plate represented in FIG. 2*a* are cover contact connection pads DK, which are electrically connected both to the housing cover and to the ground connections in the interior of the base plate. These cover contact connection pads are accordingly arranged outside the surface provided for substrate SU, which is indicated by a broken line in FIG. 2*a*.

Figure 2B:
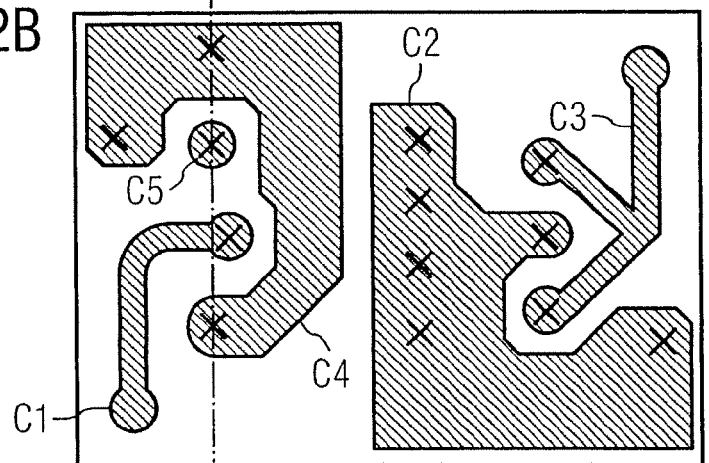
Figure 2C:
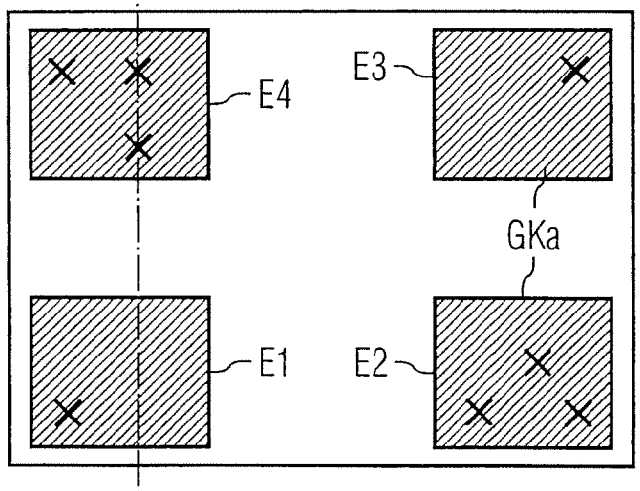

FIG. 2*b* shows the metallization of the central metallization plane, which is separated by a dielectric layer DL1 from the metallization plane shown in FIG. 2*a*, and by another dielectric layer DL2 from the metallization planes shown in FIG. 2*c*. The dielectric layers are preferably made of ceramic, but can consist of other materials, particularly plastic material or glass. In the central metallization plane according to FIG. 2*b*, two ground surfaces C2 and C4 are provided. The via-holes in the upper metallization plane are marked by crosses. The result is that ground surface C2 is connected to five internal housing contacts of the upper metallization plane and accordingly to five ground terminals of the filter. Internal ground surface C2 is further connected to a cover contact connection L3 on the first metallization plane. Second metallization plane C4 is connected to only one internal housing contact (G2) for a ground terminal, as well as to two cover contact connections L1, L2. A conductor trace structure C3 represents an electrical connection between the two terminals of the output transducers of the first sub-filter TF2. An additional conductor trace C1 isolated therefrom is connected to an internal housing contact I1 for the input IN. An additional contact C5 of the central metallization plane is connected to an internal housing contact provided for a ground terminal G1.

FIG. 2*c* shows the lower metallization plane, which is formed of four external housing contacts GKa. The via-holes to the central metallization plane are again marked by crosses. The result is that first external housing contact E1 its connected via a via-hole to conductor trace C1 and the latter is conducted via a via-hole to the input of the first sub-filter. A third external housing contact E3 is connected via a via-hole to conductor trace C3, and the latter is connected in turn to the two terminals of the two output transducers of the second sub-filter. Internal ground surface C2 is connected via three via-holes to second external housing contact E2. Fourth external housing contact E4 is connected via two via-holes to internal ground surface C4, and via a via-hole to terminal C5 on the central metallization plane.

Figure 3A:
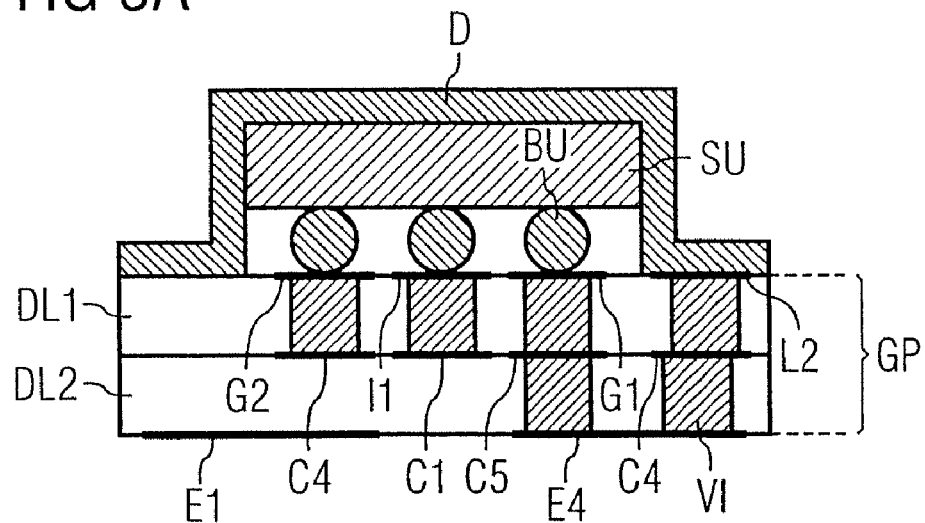

FIG. 3A shows a cross section along section line A-A' indicated in FIG. 2, through the base plate, substrate and cover of the housing. It follows from the figure that substrate SU is connected via external solder connections, implemented here as bumps BU, to the internal housing contacts on the surface of base plate GP. Housing cover D, which covers substrate SU, likewise rests upon base plate GP. Housing cover D is constructed, for example, as a metallized film laminated over the substrate on the surface of base plate GP. Cover D can also be implemented rigidly, however, and mounted on the base plate. It is also possible to close off the intermediate space between substrate SU and the surface of base plate GP at the periphery of the substrate and to produce the cover by direct metallization of the surfaces.

Corresponding to the metallization pattern represented in FIG. 2, base plate GP here comprises a first and second dielectric layer DL1, DL2 with a first metallization plane on the surface of the base plate, a second metallization plane between the first and second dielectric layers, and a third metallization plane on the underside. The electrical connections between the metallization planes are produced by the via-holes which are implemented as metallized holes through the dielectric layers, for example. The metallization inside the via-hole can close off the holes, or cover only the peripheries of the corresponding holes.

The metallizations of the metallization plane may be printed, for example, or are produced in a thin-film or thick-film process.

It is also possible to implement the metallizations by a combination of thin-film and thick-film technologies. A basic metallization can be applied in structured form, for example, and galvanically thickened.

It also follows from FIG. 3A that internal housing contact G1, which is connected to the ground terminal of first parallel resonator P1, is directly connected to external housing contact E4 by two via-holes arranged one above the other through the two ceramic layers. Internal housing contacts G2 and J1, which are connected to metallizations C4 and C1 in the second metallization plane, are only connected offset in the plane to corresponding external housing contacts. The metallized cover is connected by a cover contact connection pad L2 to metallization surface C4 of the central metallization plane via a via-hole and via an additional via-hole to external housing contact E4.

Figure 3B:
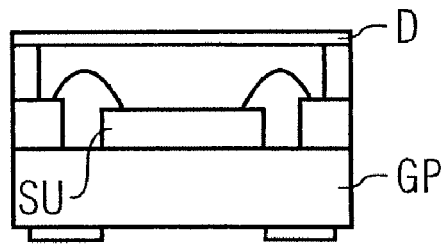

FIG. 3B shows in a schematic cross section a filter in which substrate SU is adhered into a housing consisting of a base plate GP and cover D, and is contacted with bond wire connections. The via-holes to the external housing contacts are not shown.

Figure 3C:
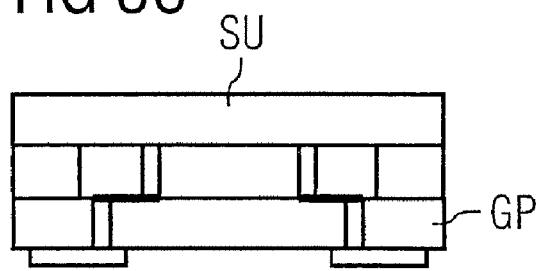

FIG. 3C shows in a schematic cross section a filter in which a lower housing part is formed by a single-layer base plate GP and a frame on which substrate SU rests as a cover. The connections of substrate SU to the internal housing contacts are possible, for instance, via metallic structures, in particular bumps.

Figure 4:
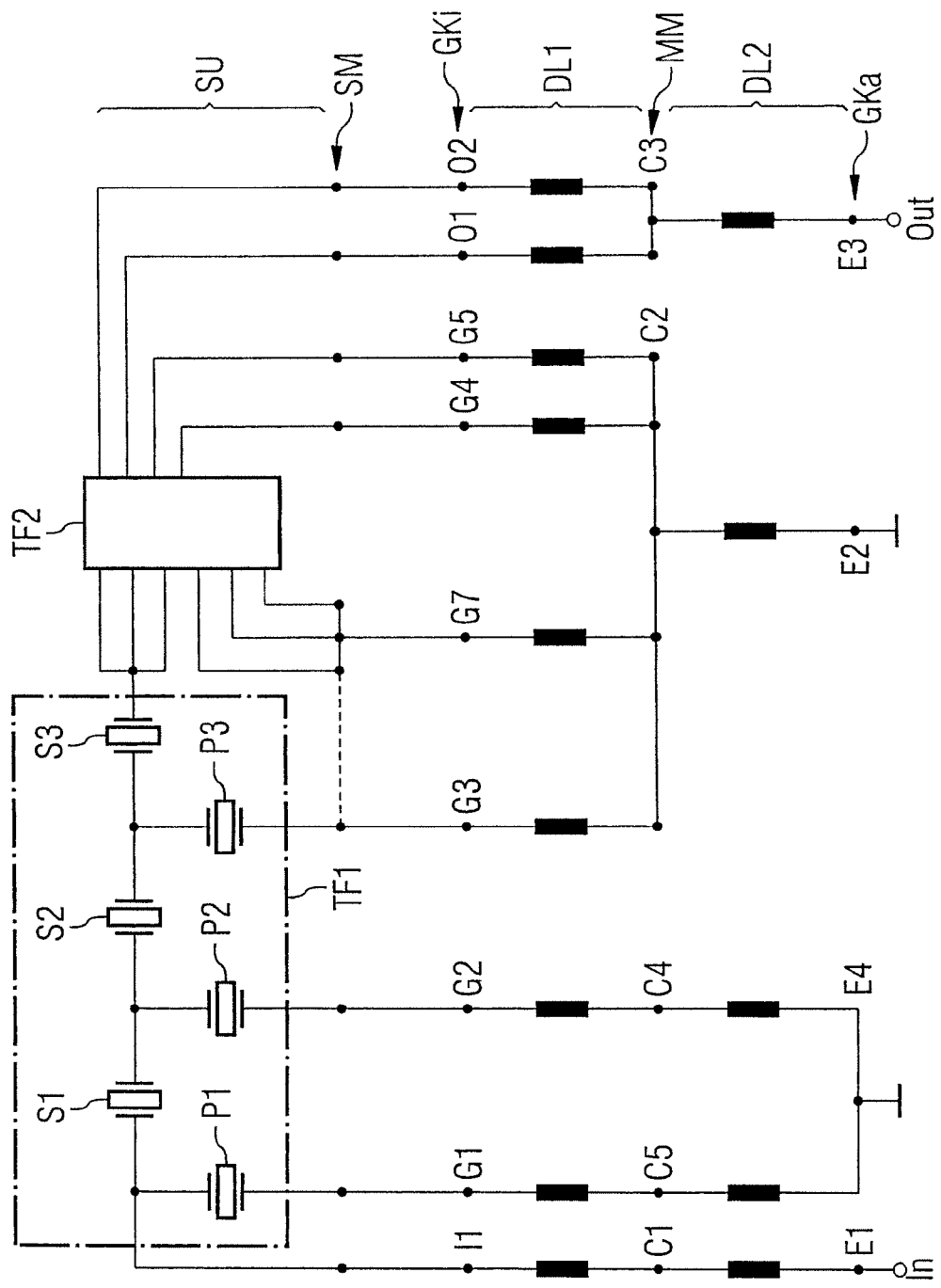
Figure 6A:
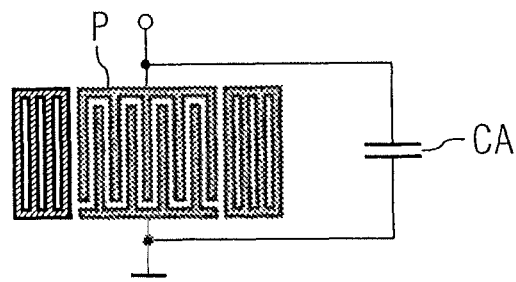
Figure 6B:
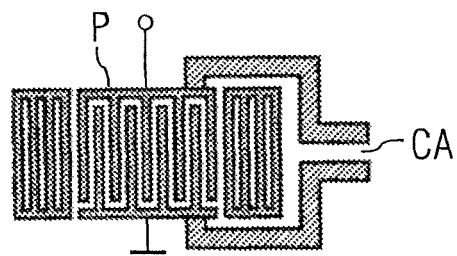
Figure 6C:
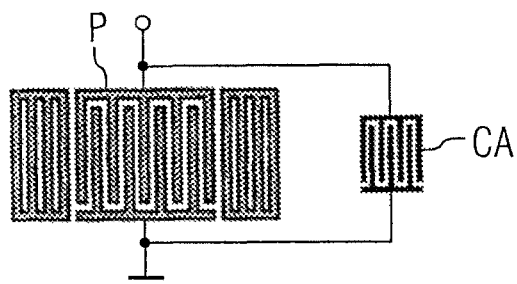
Figure 6D:
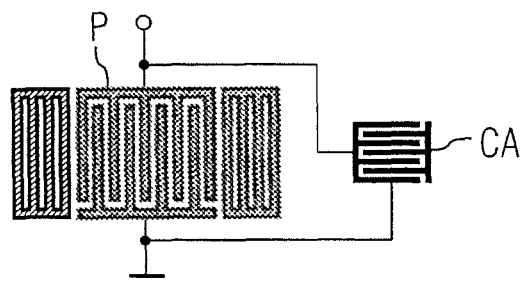

FIG. 4 shows a schematic equivalent circuit diagram of the filter, including the connections provided in the base plate and their parasitic inductances (lead-through inductances). The various filter elements are separated in the figure according to the position or their origin. There is therefore a distinction from top to bottom of the planes of the filter structures on the substrate: the plane of the internal housing contacts, the plane of the first dielectric layer DL1, which is noticeable only in the form of through-contact inductances, the central metallization plane MM, second dielectric layer DL2 with its through-contact inductances and finally the plane of external housing contacts $GK_a$. The inductances on the substrate are neglected. The internal housing contacts $GK_I$ are found in the uppermost metallization plane, with contact I1 connected to the input, G1 to first parallel resonator P1, G2 to second parallel resonator P2, and G3 to third parallel resonator P3. The ground contacts of second sub-filter TF2 on the side of the output terminals are already connected to one another on the plane of substrate metallization SM and connected to a single internal housing contact G7. The other two ground terminals of the second sub-filter are connected to housing contacts G4 and G5. The two outputs are connected to housing contacts O1 and O2.

It is quite recognizable from the figure that the ground contacts of the first two parallel resonators P1 and P2 are led separately from one another through the base plate of the housing and connected only on the lowermost metallization plane to external housing contact E4. Thereby the two parallel resonators are well decoupled from one another. The two outputs of the second sub-filter are led separately from one another up to the central metallization plane MM, and only connected there via metallization C3. The ground terminals of the third parallel resonator as well as all ground terminals of the second sub-filter are connected to metallization surface C2 on central metallization plane MM, and are connected from there via three parallel via-holes to external housing contact E2, which represents a ground terminal.

The ground connection scheme shown in FIG. 4 is optimized to the embodiment selected and represented in FIG. 1 and shows optimal properties with regard to selection and adjacent-band suppression. If several external housing contacts are available, it is also possible to separate the ground terminals for the first and the second parallel resonator and supply them to separate external housing contacts. In the next step, the ground contact for the third parallel resonator could also be led to an external housing contact of its own. A separation of the ground terminals of the second sub-filter with regard to the input and the output transducers would also improve selection and adjacent-band suppression.

The housing, or the base plate implemented here as a multilayer structure, is optimized in the sense that the lead-through inductances are minimal. This is achieved particularly with small via-holes or with a small thickness of the dielectric layers, but also by way of parallel-connected lead-throughs. The inductance can be further influenced by the geometric implementation of the via-hole. With low inductance values of the via-holes, a passband with steep edges is achieved. If several ground contacts are unified on central metallization plane MM and fed by means of a single via-hole to an external housing contact, for instance the via-hole that connects inner metal surface C2 to housing contact E2, then this last common via-hole is particularly critical with respect to its inductance value and strongly influences the coupling of the ground terminals. It therefore makes sense to design the second dielectric layer to be thinner than the first dielectric layer.

In a variation of the example of a filter represented in FIG. 4, it is possible to connect the ground terminals connected to internal housing contacts G3 and G7 already on the substrate, in which case an even somewhat higher selection results. Not shown in FIG. 4 is a connection of housing cover D via which ground surfaces C2 and C4 are indirectly connected. Because both C2 and C4 are directly connected to the good grounds E2 and E4, the influence of the cover is minimized but still clearly present, as FIG. 10 later shows.

Also not shown in the equivalent circuit diagram are high-ohmic connections with which housing contacts G1, G2, G7 and G3 or the terminals connected to them on the substrate are connected to one another in order to lead off the charge resulting from the pyroelectric behavior of the substrate in a manner harmless to the component. These charges can appear particularly in case of temperature changes or in the case of arcing, and can damage or even destroy the metallization layer or the substrate.

In FIG. 5, the metallization scheme within two sub-filters represented in FIG. 1 is varied in the sense that a symmetrical operation at the output is now made possible. For this purpose, the electrode structure of one (the right-hand) output transducer is mirrored in comparison to the other output transducer, so that two signals shifted in phase by 180° are obtained at the two output terminals. Therefore an additional external housing contact is required for the additional signal. As a variation from the circuit represented in FIG. 4, the two output terminals for a filter operated symmetrically at the output are led separately from one another through the base plate and connected to separate external housing contacts. The number of minimally required external housing contacts correspondingly increases to five.

FIG. 6 shows capacitors connected in parallel to the parallel resonators, whereby the edge steepness of the filter can be improved, particularly the left edge of the passband. The capacitors are favorably realized on the substrate surface in the form of connection surfaces or as interdigital structures. FIG. 6a shows such a capacitor in the schematic equivalent circuit diagram. FIG. 6b shows an implementation as adjacent metallization planes between which capacitor CA can be formed. FIG. 6c shows a capacitor formed as an interdigital structure that has a smaller finger period than the transducers of the parallel resonator. FIG. 6d likewise shows an interdigital structure, which is rotated by 90° in the orientation on the substrate with respect to the orientation of the parallel resonator. Additionally, the finger period can be even smaller than that of the interdigital transducer. With capacitors CA connected in parallel to series resonators, the steepness of the right edge of the passband can also be improved.

FIG. 7 shows a transmission function S21 (see curve a) obtained with a filter according to the invention in comparison to the transmission function of a filter according to prior art (curve b) which has two series-connected 3-transducer DMS structures and additionally contains a parallel resonator at the input and at the output. It is shown that the proposed filter is markedly improved both with regard to edge steepness and to adjacent-band suppression.

Figure 8:
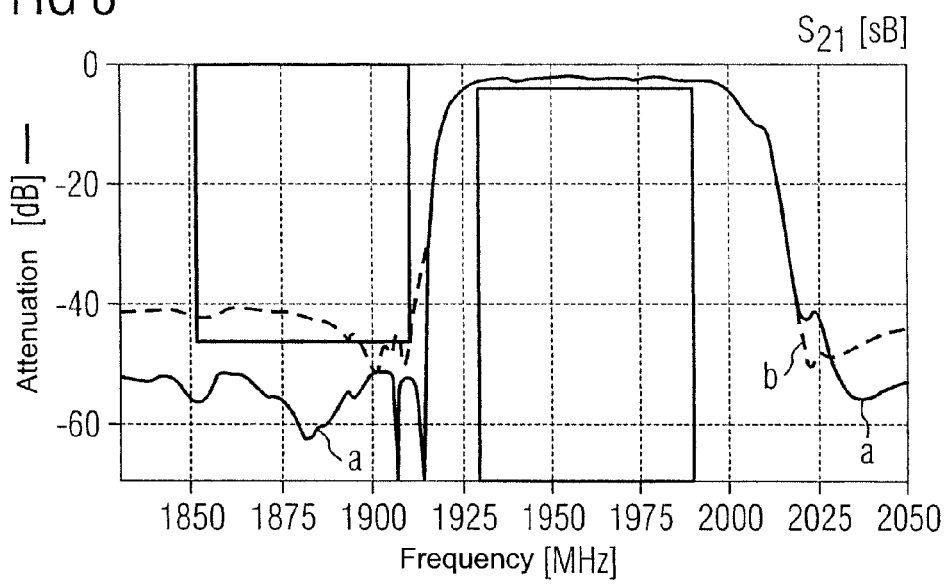
Figure 9:
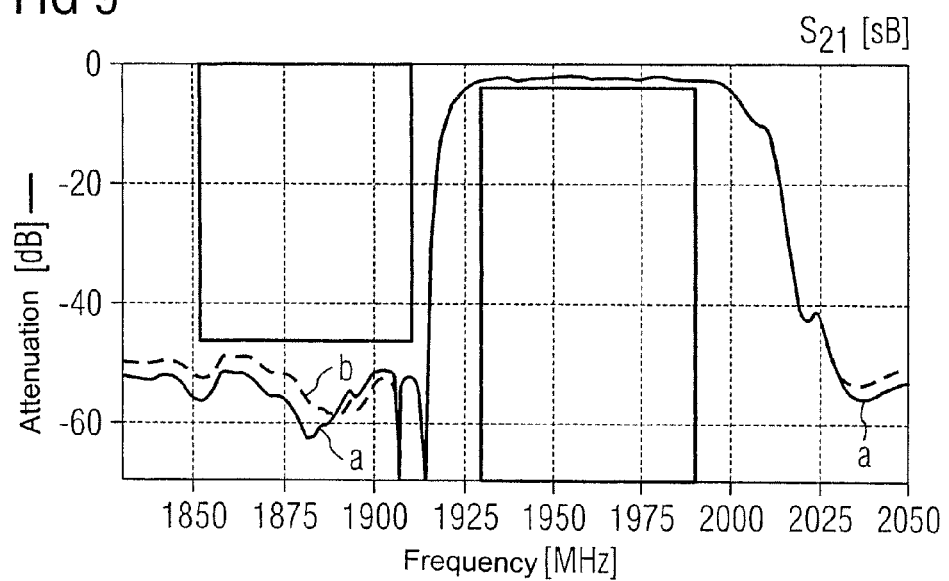

The effect which the separated grounds have on filter behavior is once again shown on the basis of examples of transmission curves S21 in FIG. 8. Two transmission curves S21 and two filters are compared, more particularly, a filter constructed as proposed according to FIG. 4 (see curve a) compared to a similar filter in which the ground conductors C2 and C4 of central metallization plane MM are directly connected to one another (see curve b). The pronounced effect with regard to edge steepness (the left edge) and adjacent-band suppression are clearly shown FIG. 9 also shows the advantage of the separate grounding by comparing the transmission curve of a filter according to the invention constructed as in FIG. 4 (see curve a) to the transmission curve of a filter in which the ground terminals of the first two parallel resonators corresponding to points C4 and C5 are connected to one another in central metallization plane MM (see curve b). Here as well, the improvement of selection and particularly the improved adjacent-band suppression are shown.

Figure 10:
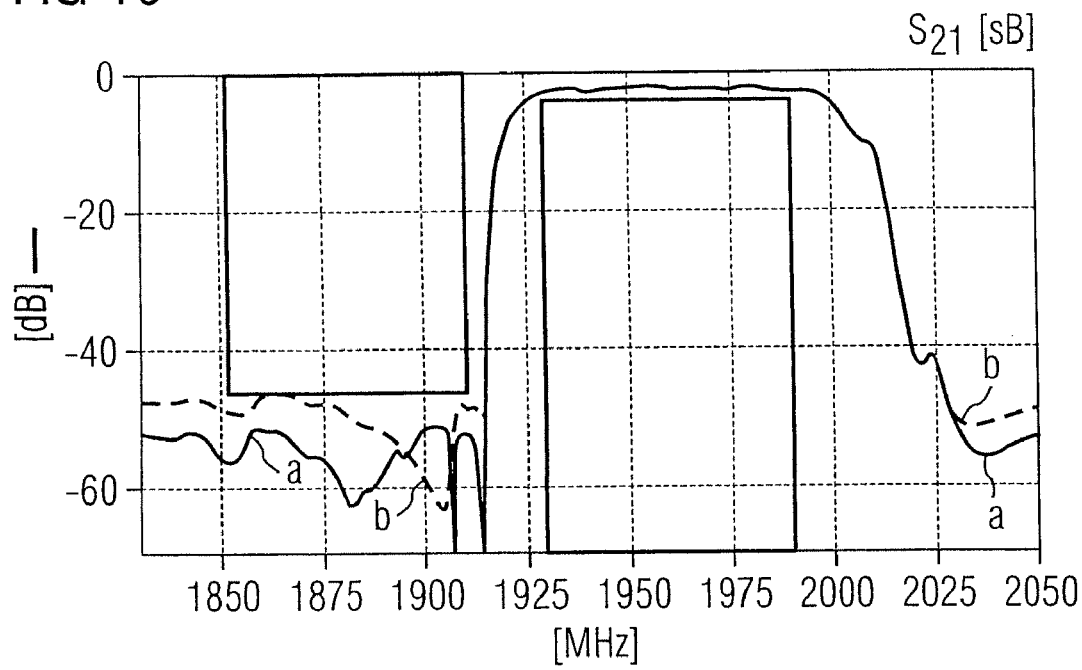

An effect that is brought about by the electrical connection of the cover as proposed is shown in FIG. 10. What is being compared here is the transmission curve of a cover connected as in FIG. 2, which is connected to ground surface C2 via an internal housing contact L3 and a via-hole as well as being connected via internal housing contacts L1 and L2 and a respective via-hole to ground C4. This filter is compared to a symmetrically connected cover in which an even number of via-holes are led to ground conductors C2 and C4 (curve b). It is shown that a positive effect with regard to selection and in particular to adjacent-band suppression is achieved with the asymmetric cover connection.

Figure 11A:
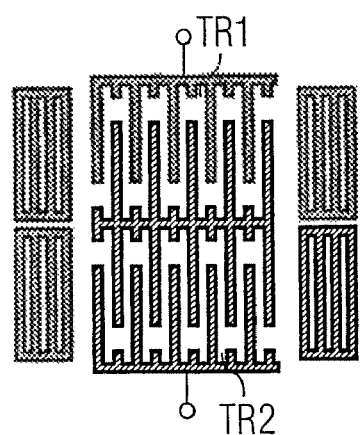
Figure 11B:
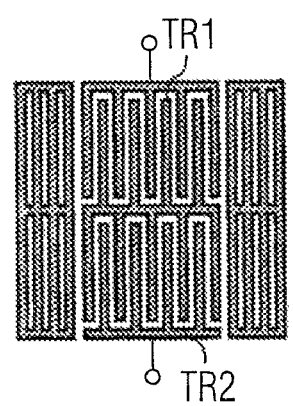

FIG. 11 shows a resonator that is subdivided into two sub-resonators TR1 and TR2 that are connected in series. The finger arrangement in FIG. 11b is such that the phase of the acoustic wave agrees in the two sub-resonators. In FIG. 11a, on the other hand, the phase of the acoustic wave in the two sub-resonators is offset by 180°. A resonator subdivided into sub-resonators can be used as a series and as a parallel resonator and improves the power durability of the corresponding resonators.

The proposed filter is not limited to the embodiment examples and can be varied within the scope of the invention, depending on the number of external housing contacts available. The housing can be constructed of only one dielectric layer or of additional dielectric layers and additional metallization planes. With regard to the materials as well, deviations from those proposed are possible. The first sub-filter can also be arranged on a separated second substrate or can be constructed of elements other than SAW resonators, for instance, from BAW resonators operating with bulk acoustic waves.

The invention claimed is:

1. A RF filter comprising:
   at least one substrate,
   a first sub-filter on the substrate comprising a series resonator and a first parallel resonator in a first parallel branch, a second parallel resonator in a second parallel branch, and a third parallel resonator in a third parallel branch, the parallel branches being connected to a signal path comprising the series resonator;
   a second sub-filter comprising a dual-mode surface wave elements filter (DMS SAW), connected in series to the first sub-filter in the signal path,
   a housing comprising a base plate comprising:
      at least one dielectric or nonconductive layer,
      a plurality of internal housing contacts on the base plate connected to terminal surfaces on the substrate, and
      a plurality of external housing contacts on an underside of the base plate, the external housing contacts being connected to the internal housing contacts via lines, the number of external housing contacts being less than the number of internal housing contacts,
   at least two separate lines on the base plate or in the base plate for connecting ground terminals of the first parallel resonator and of the second sub-filter to at least two different external housing contacts,
   wherein the ground terminal of the first parallel resonator is contacted directly by via-holes without additional wiring to a first external housing contact of the number of external housing contacts,
   wherein the ground terminal of the first parallel resonator and a ground terminal of the second parallel resonator are separate from one another and are connected to the first external housing contact, and
   wherein a ground terminal of the third parallel resonator and the ground terminals of the second sub-filter are connected to a second external housing contact of the number of external housing contacts.

2. The filter of claim 1,
   wherein the base plate includes at least two dielectric layers and a metallization plane between the at least two dielectric layers configured to form a circuit connected to the internal housing contacts and the external housing contacts by via-holes.

3. The filter of claim 1, wherein the DMS filter comprises a track with five transducers.

4. The filter of claim 3, wherein two adjacent endmost electrode fingers of different transducers in second sub-filter are connected to a signal line or connected to the ground terminal.

5. The filter of claim 1,
   further comprising:
   a second series resonator.

6. The filter of claim 5, wherein a third series resonator is located between the second series resonator and the DMS filter.

7. The filter of claim 5, wherein at least the third or the first and the third parallel resonator are cascaded, such that the first sub-filter has subdivided portions of at least two sub-resonators connected in series.

8. The filter of claim 5, wherein at least the first or the first and the second series resonator are cascaded, such that the first sub-filter has subdivided portions of at least two sub-resonators connected in series.

9. The filter of claim 1, wherein:
the first sub-filter has an asymmetric output;
the second sub-filter has an asymmetric input; and
the housing has four or five external housing contacts.

10. The filter of claim 1, wherein:
the first sub-filter has an asymmetric input;
the second sub-filter has an asymmetric output; and
the housing has four or five external housing contacts.

11. The filter of claim 1, wherein:
the first sub-filter has an asymmetric input;
the second sub-filter has a symmetric output; and
the housing has five or six external housing contacts.

12. The filter of claim 1, wherein some ground terminals of the RF filter are interconnected on the substrate high-ohmically.

13. The filter of claim 1, wherein some ground terminals of the RF filter are connected to one another by a resistance of greater than about 1 kΩ.

14. The filter of claim 1, further comprising a cover comprising at least one electrically conductive layer, wherein: the substrate is between the base plate and the cover, the cover is electrically connected to circuitry in the base plate; and the cover interconnects any ground terminals of the filter.

15. The filter of claim 14, wherein the cover is connected to the external housing contacts by a plurality of via-holes, wherein the connection to an input-side ground terminal comprises a first set of via-holes connected in parallel and the connection to an output-side ground terminal comprises a second set of via-holes, the number of via-holes in the first set of via-holes being greater than the number of via-holes in the second set of via-holes.

16. The filter of claim 14, wherein the cover is asymmetrically connected to the circuitry.

17. The filter of claim 1, further comprising two separate internal ground conductors in the base plate connected to a plurality of ground terminals of the first and the second sub-filters.

18. The filter of claim 17, wherein at least one of the internal ground conductors is connected via a plurality of via-holes to at least one external housing contact.

19. The filter of claim 1, further comprising capacitors connected in parallel to the first and second parallel resonators.

20. The filter of claim 19, wherein the capacitors comprise an interdigital structure.

21. The filter of claim 20, wherein the interdigital structure of the capacitors is rotated with respect to the interdigital structure of the first and second parallel resonators.

22. The filter of claim 19, wherein the capacitors comprise metallizations on the substrate.

* * * * *

UNITED STATES PATENT AND TRADEMARK OFFICE
CERTIFICATE OF CORRECTION

| | | |
|---|---|---|
| PATENT NO. | : 8,179,211 B2 | Page 1 of 1 |
| APPLICATION NO. | : 11/995022 | |
| DATED | : May 15, 2012 | |
| INVENTOR(S) | : Thomas Bauer and Christian Math | |

It is certified that error appears in the above-identified patent and that said Letters Patent is hereby corrected as shown below:

On the Title page:

Column 1, Item (22) PCT Filed: delete "Jun. 06, 2006" and insert -- Jun. 02, 2006 --, therefor.

Signed and Sealed this
Third Day of July, 2012

David J. Kappos
*Director of the United States Patent and Trademark Office*